United States Patent
Fifield et al.

(10) Patent No.: US 9,953,727 B1
(45) Date of Patent: Apr. 24, 2018

(54) CIRCUIT AND METHOD FOR DETECTING TIME DEPENDENT DIELECTRIC BREAKDOWN (TDDB) SHORTS AND SIGNAL-MARGIN TESTING

(71) Applicant: GLOBALFOUNDRIES INC., Grand Cayman (KY)

(72) Inventors: John A. Fifield, Burlington, VT (US); Eric D. Hunt-Schroeder, Essex Junction, VT (US); Darren L. Anand, Williston, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/430,170

(22) Filed: Feb. 10, 2017

(51) Int. Cl.
G11C 7/00 (2006.01)
G11C 29/00 (2006.01)
G11C 17/18 (2006.01)
G11C 17/16 (2006.01)

(52) U.S. Cl.
CPC ............. *G11C 29/78* (2013.01); *G11C 17/16* (2013.01); *G11C 17/18* (2013.01)

(58) Field of Classification Search
CPC .......... G11C 29/78; G11C 17/18; G11C 17/16
USPC .................................................. 365/205, 96
See application file for complete search history.

(56) References Cited

U.S. PATENT DOCUMENTS

| 6,621,259 | B2* | 9/2003 | Jones | G01R 19/0092 324/123 C |
| 8,717,823 | B2 | 5/2014 | Kim et al. | |
| 9,418,745 | B1* | 8/2016 | Chen | G11C 16/14 |
| 9,837,168 | B1* | 12/2017 | Fifield | G11C 17/18 |
| 2004/0206994 | A1* | 10/2004 | Park | B82Y 10/00 257/295 |
| 2005/0122769 | A1* | 6/2005 | Miyatake | G11C 11/16 365/158 |
| 2006/0034133 | A1* | 2/2006 | Sekiguchi | G11C 5/063 365/190 |
| 2006/0152970 | A1* | 7/2006 | DeBrosse | G11C 11/16 365/171 |
| 2007/0165441 | A1* | 7/2007 | Kurjanowicz | G11C 17/16 365/96 |
| 2007/0182458 | A1* | 8/2007 | Park | G11C 7/065 327/51 |
| 2009/0086559 | A1* | 4/2009 | Ohsawa | G11C 11/404 365/205 |
| 2010/0054042 | A1* | 3/2010 | Miki | G11C 29/026 365/185.21 |

(Continued)

FOREIGN PATENT DOCUMENTS

EP 3038111 6/2016

*Primary Examiner* — Viet Q Nguyen
(74) *Attorney, Agent, or Firm* — Anthony Canale; Andrew Calderon; Roberts Mlotkowski Safran Cole & Calderon, P.C.

(57) ABSTRACT

The present disclosure relates to a structure which includes a twin-cell memory which is configured to program a plurality of write operations, a current sense amplifier which is connected to the twin-cell memory and is configured to sense a current differential and latch a differential voltage based on the current differential, and at least one current source which is connected to the current sense amplifier and is configured to add an offset current to the current sense amplifier to create the differential voltage.

12 Claims, 5 Drawing Sheets

(56) References Cited

U.S. PATENT DOCUMENTS

| | | | |
|---|---|---|---|
| 2012/0182782 A1* | 7/2012 | Kurjanowicz | G11C 17/16 365/94 |
| 2013/0148432 A1* | 6/2013 | Castillon | G11C 7/02 365/185.21 |
| 2014/0355360 A1* | 12/2014 | Chen | G11C 7/08 365/189.06 |
| 2015/0117109 A1* | 4/2015 | La Rosa | G11C 16/0425 365/185.18 |
| 2016/0217832 A1* | 7/2016 | Jayaraman | G11C 7/065 |
| 2016/0372164 A1* | 12/2016 | Anand | G11C 7/065 |
| 2017/0365302 A1* | 12/2017 | Anand | G11C 17/18 |

* cited by examiner

CIRCUIT AND METHOD FOR DETECTING TIME DEPENDENT DIELECTRIC BREAKDOWN (TDDB) SHORTS AND SIGNAL-MARGIN TESTING

FIELD OF THE INVENTION

The present disclosure relates to detecting time dependent dielectric breakdown (TDDB) shorts and signal-margin testing, and more particularly, to a circuit and a method for detecting time dependent dielectric breakdown (TDDB) shorts and signal-margin testing for non-volatile memory array.

BACKGROUND

There are various types of one-time programmable memory (OTPM) arrays that represent embedded non-volatile memory (NVM) technologies. In a specific type of OTPM, a write operation occurs over many write-verify cycles to achieve a large threshold voltage shift of a memory twin-cell. Further, depending on mismatches within an OTPM twin-cell, the number of write-verify cycles may vary significantly. Each of the write operations include a write followed by a bitline leakage test to check for dielectric breakdown and also a verify (i.e., read) to check if the cell is written.

In OTPM systems, the operations of the memory are performed one address at a time. For example, a single write operation may take approximately 8 milliseconds. Further, programming occurs with a high wordline voltage (approximately 2 volts) and a high (i.e., elevated) source line (approximately 1.5 volts) which induces an approximate 2 mA current flowing through the transistor being programmed. This high stress operation forces electrons to be trapped in the oxide of the transistor being programmed, shifting the threshold voltage of the transistor. This type of OTPM is referred to as a charge trap memory. In this scenario, a time dependent dielectric breakdown (TDDB) results in a wordline to bitline short with a resistance, which causes other parallel cells to have a crippled wordline during programming and reading.

SUMMARY

In an aspect of the disclosure, a structure includes a twin-cell memory which is configured to program a plurality of write operations, a current sense amplifier which is connected to the twin-cell memory and is configured to sense a current differential and latch a differential voltage based on the current differential, and at least one current source which is connected to the current sense amplifier and is configured to add an offset current to the current sense amplifier to create the differential voltage.

In another aspect of the disclosure, a method includes skewing a sense amplifier connected to a twin-cell memory array to a known logic state, reading an output of the sense amplifier with a plurality of wordlines connected to the twin-cell memory array turned off, and detecting a time dependent dielectric breakdown (TDDB) failure of the twin-cell memory in response to the output of the sense amplifier being an opposite logic state of the known logic state.

In another aspect of the disclosure, a method includes programming a twin-cell for a predefined programming interval, skewing a sense amplifier connected to a twin-cell memory array to a known logic state, reading an output of the sense amplifier with a plurality of wordlines connected to the twin-cell memory array turned off, and detecting a time dependent dielectric breakdown (TDDB) failure of the twin-cell memory in response to the output of the sense amplifier being an opposite logic state of the known logic state.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
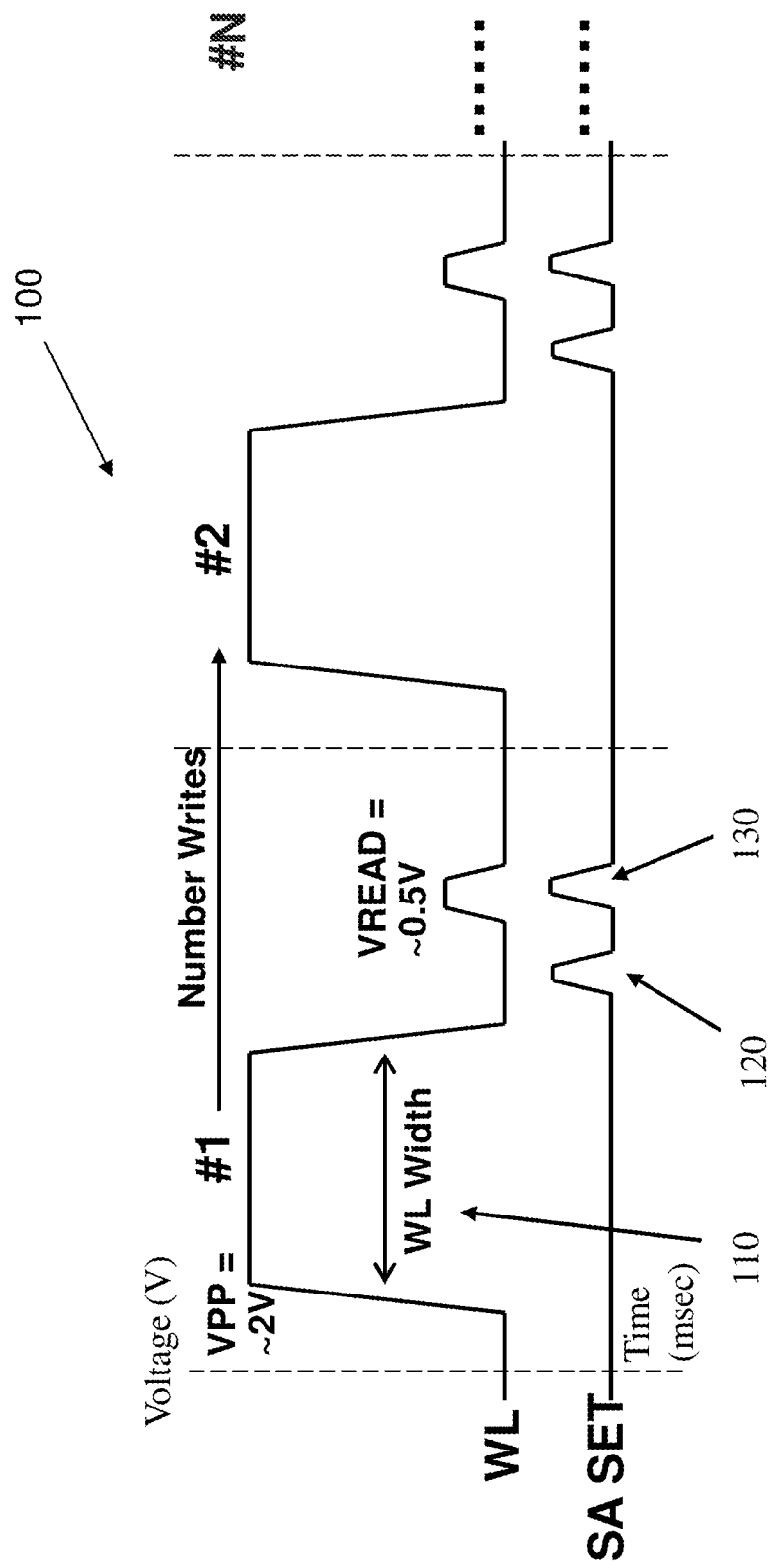
FIG. 1 shows a multi-step write operation in accordance with aspects of the present disclosure.

The present disclosure relates to detecting time dependent dielectric breakdown (TDDB) shorts and signal-margin testing, and more particularly, to a circuit and a method for detecting time dependent dielectric breakdown (TDDB) shorts and signal-margin testing for non-volatile memory array. In more specific embodiments, a bitline leakage test within every write-verify cycle will ensure that the transistor being programmed is tested for TDDB shorts. Advantageously, by implementing the bitline leakage test, the transistor being programmed will stop being written for the remaining write operations, thereby preventing further stress to the transistor and allowing other cells to continue being written.

In a non-volatile cell, a threshold voltage (Vt) shift is dependent on the charge being trapped in the oxide of a pair of field effect transistors (FETs). Programming the FETs increases the threshold voltage (Vt), which can raise the possibility of damaging the oxide (i.e., gate of a FET is shorted to the source). When a TDDB failure occurs, the gate is shorted to the source or drain in the FET, depending on the bias conditions. Further, a one time programmable memory (OTPM) array uses a twin-cell and a pair of FETs to program the OTPM array. The twin-cell of the OTPM is a pair of thin oxide high threshold voltage (HVT) NFET base devices.

Further, the twin-cell of the OTPM includes a true NFET transistor and a complement NFET transistor. Each gate of the true NFET transistor and the complement NFET transistor is connected to a word line WL. The source of the true NFET transistor is connected to the source of the complement NFET transistor, and the sources of both the true NFET transistor and the complement NFET transistor are connected to the source line SL. The drain of the true NFET transistor is connected to a bitline true (BLT) and the drain of the complement NFET transistor is connected to a bitline complement (BLC).

In the twin-cell of the OTPM array, programming is performed with the wordline WL and a source line SL elevated (i.e., an elevated source line (ESL)). Further, one of the bitlines (i.e., either BLT or BLC) is held to ground and the other bitline is floated. During programming, charge trapping will shift the threshold voltage (Vt) up on one of the NFETs (i.e., either the true NFET transistor of the complement NFET transistor) in the twin-cell, weakening the transistor. A sense amplifier can then compare a differential current between the bitline true (BLT) and the bitline complement (BLC). Further, in an OTPM array, prior to programming, an initial data state is unknown (i.e., array data is "x").

An OTPM write operation can occur over many write-verify cycles to achieve a large (e.g., 10's of mV) threshold voltage (Vt) shift of a cell. Further, depending on the mismatch within the OTPM high threshold voltage (HVT) twin-cell, the number of write-verify cycles may vary significantly. Each write operation is expected to take approximately 8 milliseconds. Thus, margin is incorporated into the write operation so that charge lost through end of life (e.g., 10 years), thermal stress (e.g., bake), etc., does not erase the cell. Further, charge loss over time may cause an approximate loss of about 30% of threshold voltage (Vt) shift by the end of the life of the OTPM array. To solve these issues of a TDDB failure when programming a non-volatile OTPM array, the operations of the embodiments will follow a write, leak, and verify process. Therefore, in embodiments, cells suffering from a TDDB failure (i.e., wordline WL to bitline BL short) are masked off from future programming, which allows other cells in parallel to be programmed with an optimal voltage (e.g., no crippled wordline from the TDDB on another cell).

FIG. 1 shows a multi-step write operation in accordance with aspects of the present disclosure. In embodiments of FIG. 1, a multi-step write operation 100 is shown with N writes, labeled as #1, #2, . . . , #N. Further, in the multi-step write operation 100, the x-axis is time in milliseconds and the y-axis is voltage in volts. In the multi-step write operation 100, a first write operation (i.e., labeled as #1) includes a program operation 110, a leak test 120, and a read (i.e., verify) test 130.

In FIG. 1, in the program operation 110, a write pulse voltage (i.e., VPP is approximately 2 volts) is applied to gates of the twin-cell of an OTPM array. In other words, a VPP voltage, e.g., 2 volts, is applied to a wordline, which is connected to the gates of the twin-cell. Further, in the program operation, the true bitline (BLT) is grounded and the voltage of the source line SL can be lower than the VPP voltage, e.g., 1.5 volts. Further, as shown in FIG. 1, the wordline WL width is the duration of the VPP write pulse. The duration and voltages in FIG. 1 can be controlled with eFUSE options that can be set per chip. Further, as disclosed above, write operations are programmed to be completed within a predefined time, e.g., 8 milliseconds.

In FIG. 1, in the leak test 120, the OTPM array can check for time dependent dielectric breakdown (TDDB) failures that occur due to programming. In order to perform the leak test 120, a sense amplifier is skewed to a known state and a read operation occurs without any wordline WL being selected. Further, a TDDB failure on a NFET device of the twin-cell is detected as a read failure due to bitline leakage. Thus, a leak test 120 failure indicates an oxide breakdown in a cell. In addition, further writes to the cell with the TDDB failure are then masked off.

In FIG. 1, in the read (i.e., verify) test 130, the OTPM array can check if the cell is passing a margined read (i.e., overwrite protection). In the read (i.e., verify) test 130, the bitline is sensed (e.g., Vdd of approximately 200 mV) with the source line voltage (VSL) being 0 V and the wordline WL at approximately 500 mV. In FIG. 1, the read voltage (i.e., VREAD) of the wordline WL is approximately 500 mV. Further, in the read (i.e., verify) test 130, passing cells will be masked on subsequent write operations to protect them from a TDDB failure.

In FIG. 1, a second write operation (i.e., labeled as #2) repeats the same program operation 110, leak test 120, and read (i.e., verify) test 130. However, after the first write operation (i.e., labeled as #1), subsequent program operations will mask bits that either fail the previous leak test 120 or pass the previous read (i.e., verify) test 130.

Still referring to FIG. 1, the leak test 120 ensures that bitlines are truly floating and have no defective paths to ground. Further, when a shorted array device occurs (i.e., an oxide short), the bitline will have a path to ground from the bitline. In embodiments, this condition will fail the leak test 120. Further, the leak test 120 is run with the wordline WL off (i.e., WL=0 volts). Then, the sense amplifier is tilted to favor a state (i.e., a logic state). This sense amplifier offset will yield a known read result unless bitline leakage causes the sense amplifier to go the wrong way (i.e., detect a state which is opposite of the favored state). If the sense amplifier detects a state which is opposite of the favored state, a leak test 120 fail will occur.

It is possible that oxide damage creates a bitline leakage on the bitline (either BLT or BLC) being held at ground during the write operation. During a read (i.e., verify) test 130, this bitline can be checked to verify that the bitline can still go high on a read operation to any wordline WL address. Further, the leak test 120 can margin the sense amplifier to an opposite direction as the program operation 110 (i.e., write operation) and read (i.e., verify) test 130. Therefore, an input/output (I/O) block will invert a true write line signal WGDLT and a true write line complement signal WGDLC during the leak test 120 (in comparison to the program operation 110 and the read (i.e., verify) test 130). In embodiments, during the leak test 120, the write data is inverted to tilt the sense amplifier to favor the other data state. In other words, the write data will be used to determine the sense amplifier tilt.

In embodiments of the present disclosure, a method can include skewing a sense amplifier connected to a twin-cell memory array to a known logic state, reading an output of the sense amplifier with a plurality of wordlines connected to the twin-cell memory array turned off, and detecting a time dependent dielectric breakdown (TDDB) failure of the twin-cell memory in response to the output of the sense amplifier being an opposite logic state of the known logic state. Also, the method can further include masking bits of the twin-cell memory in response to detecting the TDDB failure and programming the twin-cell memory for a predefined programming interval. Further, the programming of the twin-cell memory for the predefined programming interval occurs before skewing the sense amplifier to the known logic state. The predefined programming interval is a time interval of approximately 8 milliseconds. The programming the twin-cell memory for the predefined programming interval further includes applying a write pulse to a plurality of gates of the twin-cell memory array.

The method can further include masking bits of the twin-cell memory in response to verifying that the output of the twin-cell memory array is the same value as the input of the twin-cell memory array. Further, the twin-cell memory array is included in a non-volatile one time programmable memory (OTPM).

Figure 2:
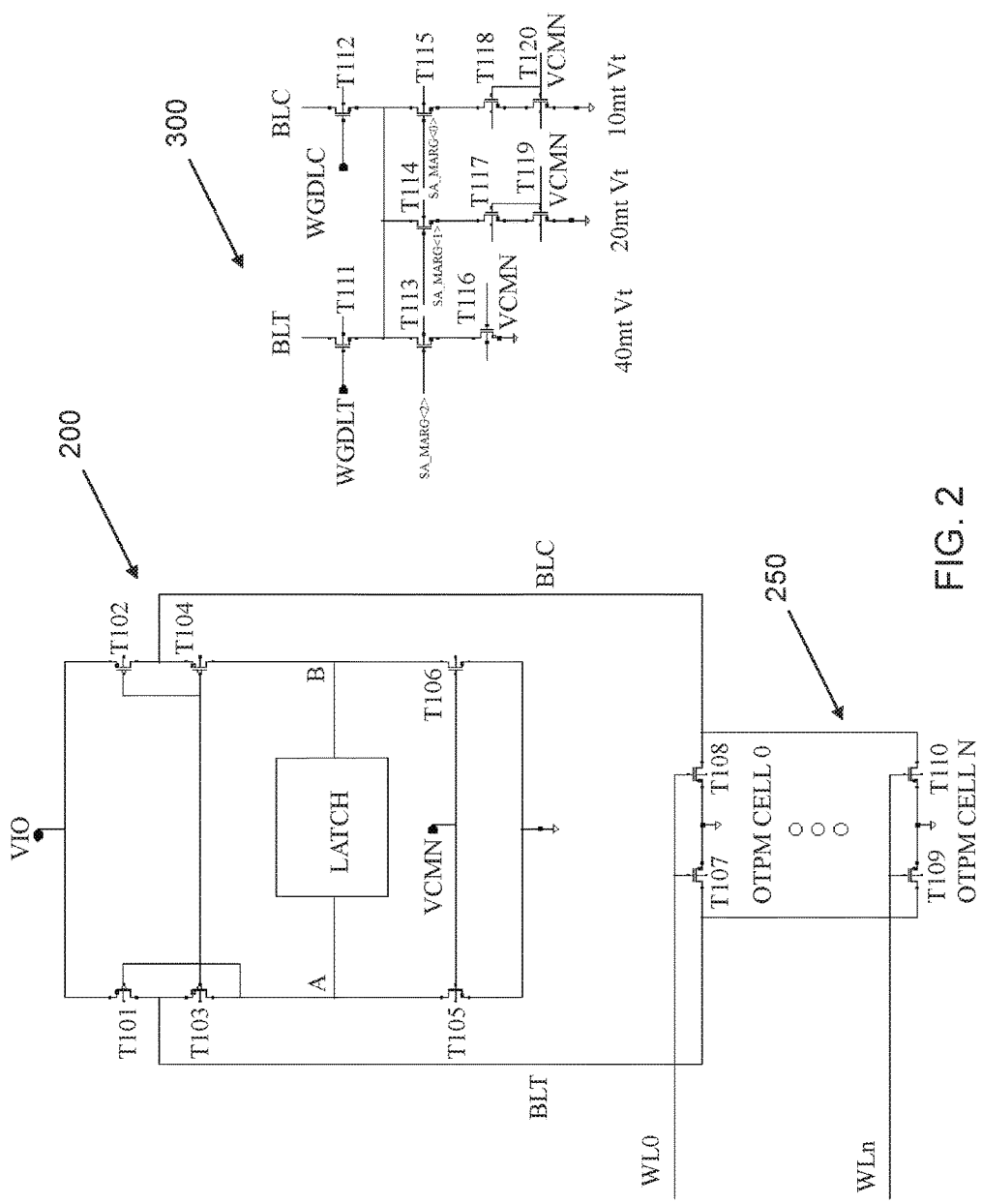
FIG. 2 shows a current sense amplifier with a margin adjustment in accordance with aspects of the present disclosure.

FIG. 2 shows a current sense amplifier with a margin adjustment in accordance with aspects of the present disclosure. In embodiments of the present disclosure, a structure can include a twin-cell memory array which is configured to program a plurality of write operations, a current sense amplifier 200 which is connected to the twin-cell memory and is configured to sense a current differential and latch a differential voltage based on the current differential, and at least one current source which is connected to the current sense amplifier and is configured to add an offset current to the current sense amplifier to create the differential voltage. This offset current enables margining the cell during programming and also mimics a known programmed threshold voltage shift in the cell.

The twin-cell memory includes a first NFET device and a second NFET device. Further, the current sense amplifier 200 is connected to the twin-cell memory array through a true bitline (BLT) and a complementary bitline (BLC). The at least one current source is configured to add an offset current to the BLT and the BLC to create the differential voltage.

The current sense amplifier 200 also includes a latch which is configured to store the differential voltage. A margin adjustment circuit 300 includes a plurality of transistors and the at least one current source. The margin adjustment circuit 300 is connected to the current sense amplifier 200 through the true bitline (BLT) and the complementary bitline (BLC). The plurality of transistors determines a magnitude of the offset current based on a plurality of sense amplifier input margin signals. Lastly, the plurality of transistors in the margin adjustment circuit 300 are all NFET devices.

In particular, FIG. 2 shows a current sense amplifier 200, an OTPM array 250, and a margin adjustment circuit 300. In FIG. 2, the current sense amplifier 200 includes transistors T101-T106, a latch, a true bitline (BLT), a complement bitline (BLC), and a current-mirror source-voltage VCMN. Transistors T101-T104 are PFET devices and T105-T106 are NFET devices. The current sense amplifier 200 performs current sensing where the differential bitline current is converted to a voltage and latched as a digital "1" or digital "0". In embodiments, a true bitline (BLT) side of the selected cell (e.g., one of OTPM cell 0 to OTPM cell n) may have a field effect transistor (FET) with a higher threshold voltage than the corresponding field effect transistor (FET) on a complement bitline (BLC) side.

In FIG. 2, the current sense amplifier 200 includes a transistor T101 which has a source connected to a voltage source VIO, a drain connected to the true bitline (BLT), and a gate connected to a drain of a transistor T103. Transistor T103 has a source connected to the true bitline true (BLT), a drain connected to a node A, and a gate connected to a gate of a transistor T104. Transistor T102 has a source connected to the voltage source VIO, a gate connected to a gate of the transistor T104, and a drain connected to the complement bitline (BLC). Transistor T104 has a source connected to the complement bitline (BLC) and a drain connected to a node B. Further, in FIG. 2, transistor T105 has a drain connected to the node A, a gate connected to a gate of transistor T106, and a source connected to ground. Transistor T106 has a drain connected to node B and a source connected to ground.

In FIG. 2, the OTPM array 250 includes a twin-cell array which includes a gate of transistor T107 and a gate of transistor T108 connected to a wordline WL0. Further, a source of the transistor T107 is connected to the source of the transistor T108. The drain of transistor T107 is connected to the true bitline (BLT) and the drain of transistor T108 is connected to the complement bitline (BLC). In the OTPM array 250, another twin-cell array includes a gate of transistor T109 and a gate of transistor T110 connected to a wordline WLn. A source of the transistor T109 is connected to the source of the transistor T110. The drain of transistor T109 is connected to the true bitline (BLT) and the drain of transistor T110 is connected to the complement bitline (BLC)

In FIG. 2, a small bias current may be applied to both the true side of the current sense amplifier 200 (i.e., a side with the true bitline (BLT)) and the complement side of the current sense amplifier 200 (i.e., a side with the complement bitline (BLC)) by NFET transistors T105 and T106. Then, conduction into a selected OTPM cell-pair causes node BLT to drop and mirror current from transistor T101 into transistor T102. When currents into the true bitline (BLT) and the complement bitline (BLC) are unequal from a programming threshold voltage difference in the OTPM cells, a large voltage differential develops on the sense amplifier 200 signal between nodes A and B. The large voltage differential (i.e., a difference between voltage_A and voltage_B) is then latched by a complementary metal-oxide-semiconductor (CMOS) latch and converted to a full voltage logic level "1" or "0".

In FIG. 2, the OTPM array 250 can be a non-volatile memory which includes a group of OTPM cells along the true bitline (BLT) and the complement bitline (BLC). Each of the OTPM cells contains a pair of field effect transistor (FET) devices (e.g., T107 and T108, T109 and T110) which have threshold voltages (Vt) different from each other as a result of programming. For example, a first transistor (e.g., T107 or T109) has a different threshold voltage from a threshold voltage of a second transistor (e.g., T108 or T110). Also, transistors T107-T110 can be NFET devices.

In further embodiments, the OTPM array 250 may include a group of OTPM cells including OTPM cell 0 to OTPM n, wherein n is the integer value representing the last OTPM cell of the OTPM array 250. Each OTPM cell is coupled to a wordline (e.g., one of wordline WL0 to wordline WLn). In embodiments, a plurality of FET memory cells (e.g., OTPM cell 0 to OTPM cell n) are arranged in differential transistor pairs (e.g., T107 and T108 or T109 and T110) and share a wordline (e.g., wordline WL0 to wordline WLn).

In FIG. 2, the margin adjustment circuit 300 includes transistors T111-T120, the true write line signal WGDLT, the true write line complement signal WGDLC, the true bitline (BLT), the complement bitline (BLC), sense amplifier margin SA_MARG <2:0> (which includes SA_MARG<2>, SA_MARG<1>, and SA_MARG<0>), and a current-mirror source-voltage VCMN. In the margin adjustment circuit 300, a group of current sources are formed by transistors T116-T120 and controlled by a current-mirror source-voltage VCMN and connected to a common node. An offset current is directed from either BLT or BLC by selection of transistors T111 or T112 with the true write line signal WGDLT and the true write line complement signal WGDLC.

In FIG. 2, a magnitude of an offset current is selected by transistors T113, T114, and T115 (i.e., current control switches), which are responsive to SA_MARGIN<2>, SA_MARGIN<1>, and SA_MARGIN<0>. Further, binary settings from 0 to 7 are referred to as DAC inputs DAC0 to DAC7. Further, in the margin adjustment circuit 300 of FIG. 2, one switch enables a current which produces a current offset equating to a 10 mV offset in a programmed cell threshold voltage (Vt), and other switches producing currents equal to 20 mV and 40 mV. By using sequential selection of DAC inputs, a signal offset can be enabled in 10 mV increments up to 70 mV. In other words, DAC0 is 0 mV (i.e., balance the sense amplifier with no skew), DAC1 is 10 mV, DAC2 is 20 mV, DAC3 is 30 mV, DAC4 is 40 mV, DAC5 is 50 mV, DAC6 is 60 mV, and DAC7 is 70 mV. In FIG. 2, DAC1, DAC2, and DAC4 are used to produce threshold voltage offsets of 10 mV, 20 mV, and 40 mV, respectively.

In FIG. 2, transistors T111-T120 of the margin adjustment circuit 300 are all NFET devices. In the margin adjustment circuit, transistor T111 has a drain connected to the true bitline (BLT), a gate connected to the true write line signal WGDLT, and a source connected to a drain of transistor T113. Transistor T113 has a gate connected to SA_MARGIN<2> and a source connected to a drain of transistor T116. Transistor T116 has a gate connected to the current-mirror source-voltage VCMN and a source connected to ground. Transistor T114 has a drain connected to the drain of transistor T113, a gate connected to SA_MARGIN<1>, and a source connected to the drain of transistor T117. Transistor T117 has a gate connected to the current-mirror source-voltage VCMN and a source connected to a drain of transistor T119. Transistor T119 has a gate connected to the current-mirror source-voltage VCMN and a source connected to ground.

In FIG. 2, transistor T112 has a drain connected to the complement bitline (BLC), a gate connected to the true write line complement signal WGDLC, and a source connected to a drain of transistor T115. Transistor T115 has a gate connected to SA_MARGIN<0> and a source connected to a drain of transistor T118. Transistor T118 has a gate connected to the current-mirror source-voltage VCMN and a source connected to a drain of transistor T120. Transistor T120 has a gate connected to the current-mirror source-voltage VCMN and a source connected to the ground.

Figure 3:
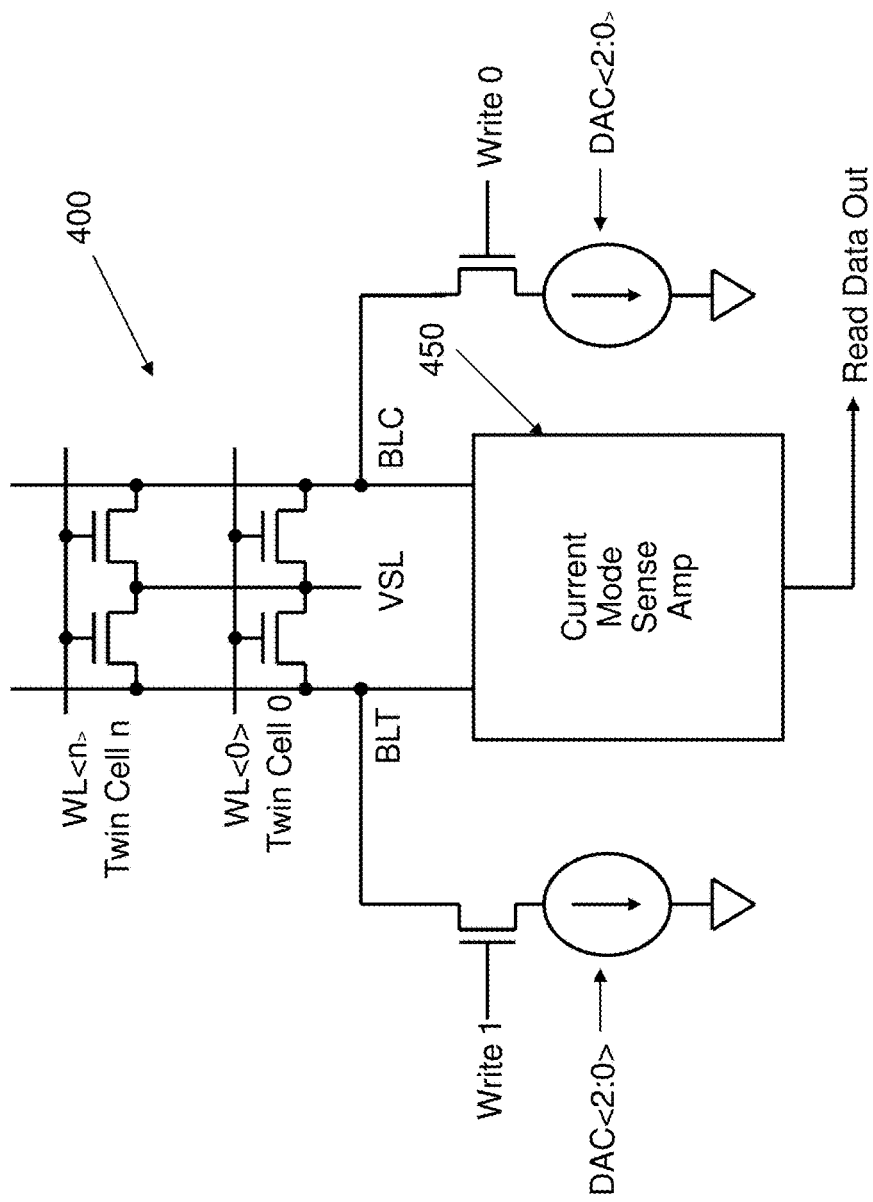
FIG. 3 shows testing a current sense amplifier with a margin adjustment in accordance with aspects of the present disclosure.

FIG. 3 shows testing a current sense amplifier with a margin adjustment accordance with aspects of the present disclosure. In FIG. 3, a testing circuit 400 includes a plurality of twin-cells (i.e., twin-cell 0 with a corresponding wordline<0> to twin-cell n with a corresponding wordline<n>), a current mode sense amplifier 450 (which corresponds to the sense amplifier 200), a true bitline (BLT), a complement bitline (BLC), Read Data Out Signal, DAC<2:0>, and Write Signals. The testing circuit 400 can perform a leak test, a tilt test, a sense amplifier test, and a wordline test.

In FIG. 3, the testing circuit 400 can perform a leak test by turning off all wordlines WL<0> to WL<n> (i.e., no cells are selected). If the write 0 signal is high and input, then the complement bitline (BLC) goes low and the true bitline (BLT) goes high. In response to the true bitline (BLT) going high, a read data out is "1" (i.e., an inversion of the write 0 signal). In the leak test, the testing circuit 400 will compensate for the read data out being an inversion from the input signal.

In FIG. 3, the testing circuit 400 can perform a tilt test by performing a read operation combined with a sense amplifier tilt (i.e., margin or skew) to measure the cell mismatching in increments of the DAC adjustments (e.g., 10 mV cell threshold voltage Vt equivalent in this scenario). The tilt test is performed prior to programming. In this scenario, all cells are expected to have less than 70 mV skew and thus should all read "0" or "1" depending on the tilt direction, which is controlled by the write data value. Cells that do not pass the tilt pass are deemed defective and can be repaired with redundancy. In the tilt test, the read data out is also an inversion from the input signal (similar to the leak test inversion). In the sense amplifier test, during a write operation, the input signal (either write 1 or write 0) is used to steal signal from the cell until the write overcomes the offset. Further, in the sense amplifier test, during a read operation, the input signal (either write 1 or write 0) will margin the read and the read data out must match the input signal used to write that address (i.e., input signal match output signal without inversion).

In FIG. 3, during a wordline test and a write operation, the input signal is used to steal signal from the cell until the write overcomes the offset. Further, in the wordline test and a read operation, the input signal will margin the read and the read data out must match the input signal used to write that address (i.e., input signal must match output signal without inversion). Further, in FIG. 3, by margining the sense amplifier and tilting the sense amplifier to favor a "1" or a "0" by pulling current off the true bitline (BLT) or the complement bitline (BLC), the embodiments are able to determine if there is a TDDB fail.

Figure 4:
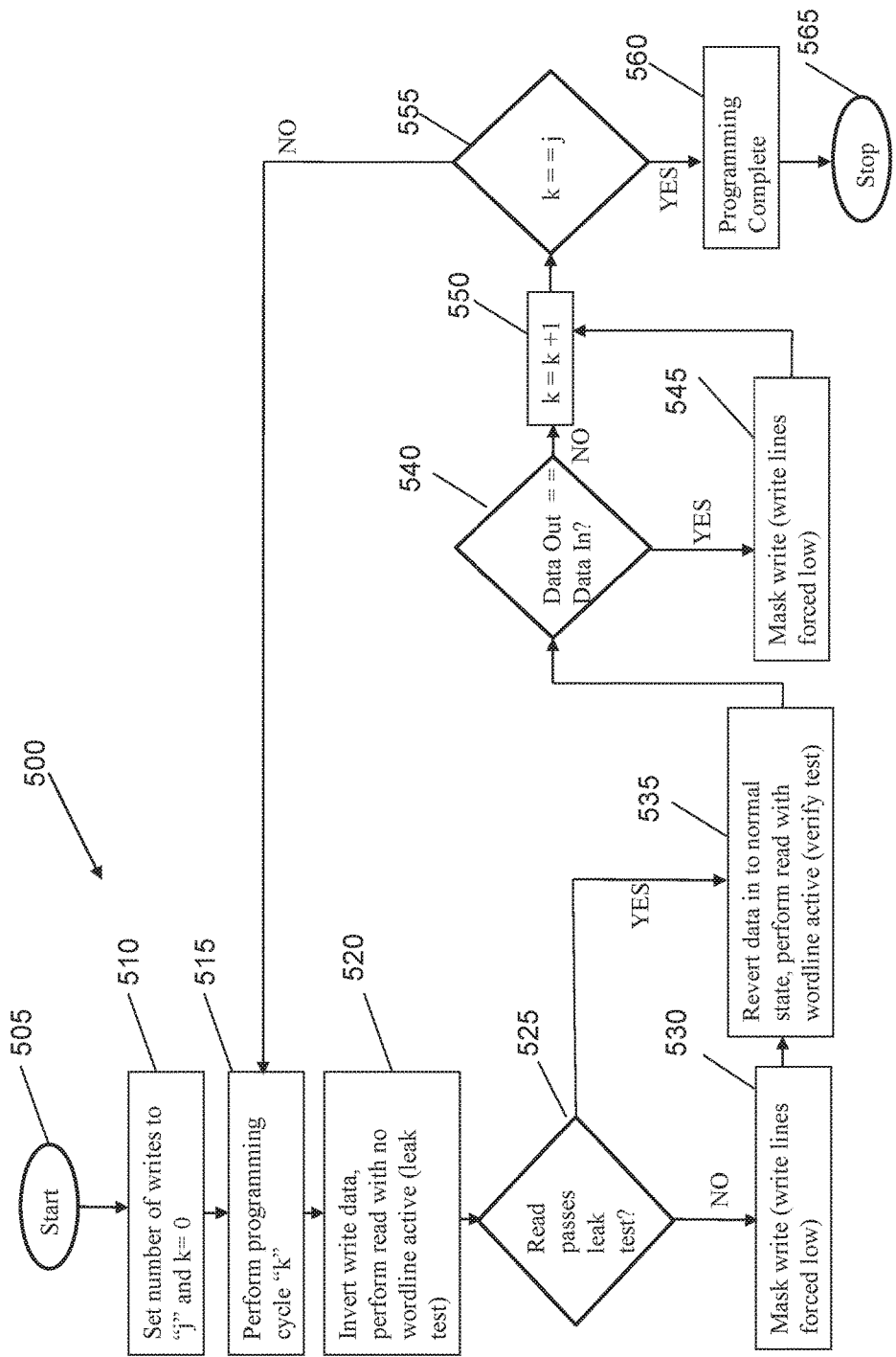
FIG. 4 shows a method of a programming operation in accordance with aspects of the present disclosure.

FIG. 4 shows method of a programming operation in accordance with additional aspects of the present disclosure. In FIG. 4, the flowchart 500 shows a method of the programming operation in accordance with embodiments of the present disclosure. In FIG. 4, the method starts at step 505. Then, at step 510, a number of writes is set to "j" and "k" is set to zero. At step 515, programming cycle "k" is performed. At step 520, the write data is inverted and leak test is performed (i.e., perform read with no wordlines activated). At step 525, if the leak test is not passed, then at step 530, writes are masked by the write lines being forced low. After step 530, the method goes to step 535.

If the leak test is passed at step 525, then the method goes to step 535. At step 535, the data is reverted to a normal state, and then a verify test is performed (i.e., perform read with wordline activated). At step 540, the data output is compared with the data input. If the data output is equal to the data input at step 540, then the writes are masked by the write lines being forced low at step 545. After step 545, the method goes to step 550.

If the data output is not equal to the data input at step 540, then the method goes to step 550. At step 550, "k" is incremented by 1. Then, at step 555, "k" is compared to "j". If "k" (i.e., the programming cycle) is equal to "j" (i.e., the total number of writes), then programming is complete at step 560 and the method ends at step 565. However, if "k" is not equal to "j", then the method returns to step 515 to perform programming cycle "k" and the method is repeated from step 515 to step 555.

Figure 5:
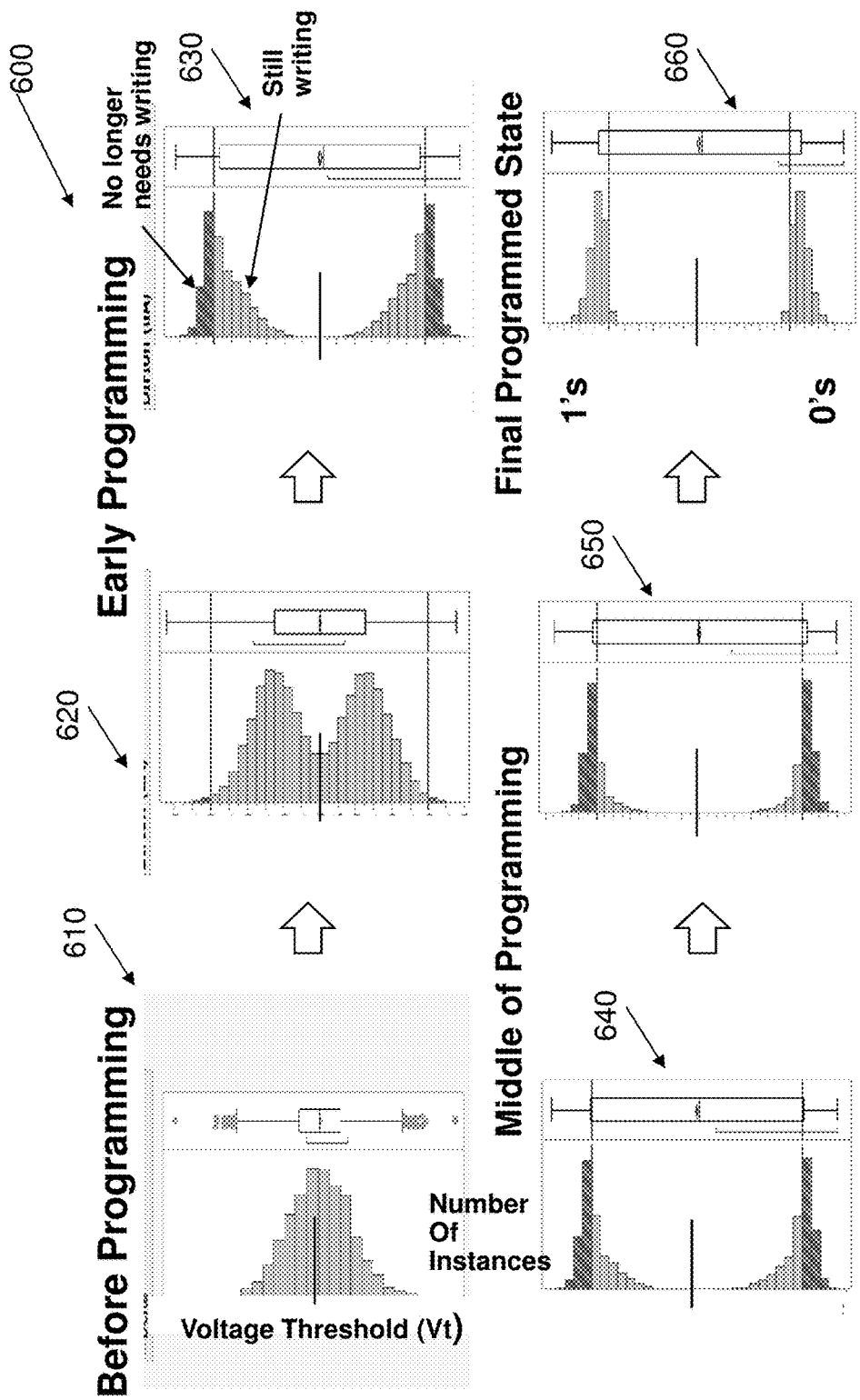
FIG. 5 shows a true/complement view of a programming operation in accordance with aspects of the present disclosure.

FIG. 5 shows a true/complement view of a programming operation in accordance with additional aspects of the present disclosure. For example, FIG. 5 shows the true/complement view 600 of the programming operation. The true/complement view 600 includes plots 610, 620, 630, 640, 650, and 660. Plots 610-660 have a threshold voltage Vt on the x-axis and the number of instances (i.e., sample size) of the threshold voltage Vt on the y-axis.

In plot 610, before programming, many of the twin-cells of an OTPM array are mismatched and the number of instances are greatest near the midpoint of the threshold voltages (Vts). After early programming, as shown in plot 620, some of the threshold voltages (Vts) are increased in both directions such that the midpoint of the threshold voltages (Vts) have a lower number and the outer portions away from the midpoint have a greater number of instances. After further programming, at plot 630, there are several twin-cells (shown in darker shade) which no longer need programming (i.e., write operations) because they have reached a value which represents a "1" or a "0".

At plot 640, programming continues, and more twin-cells (shown in darker shade) no longer need programming. At plot 650, most of the twin-cells (shown in darker shade) no longer need programming, with a few twin-cells that still need programming. Further, at plot 660, all twin-cells have been programmed and they no longer need programming. At shown in plot 660, the threshold voltages (Vts) have been pushed away from a midpoint towards either a left side (which represents a "1") or a right side (which represents a "0").

As should now be understood, in embodiments of the present disclosure, a bitline leakage test can be incorporated with every "write-verify" cycle such that the transistor being programmed is tested for a time dependent dielectric breakdown (TDDB) failure. If a cell suffers from a TDD failure (wordline WL to bitline BL short), the cell is masked off from future programming to allow other cells in parallel to programmed with an optimal wordline voltage.

The circuit and method for detecting time dependent dielectric breakdown (TDDB) shorts and signal-margin testing for non-volatile memory array of the present disclosure can be manufactured in a number of ways using a number of different tools. In general, though, the methodologies and tools are used to form structures with dimensions in the micrometer and nanometer scale. The methodologies, i.e., technologies, employed to manufacture the circuit and method for detecting time dependent dielectric breakdown (TDDB) shorts and signal-margin testing for non-volatile memory array of the present disclosure has been adopted from integrated circuit (IC) technology. For example, the structures are built on wafers and are realized in films of material patterned by photolithographic processes on the top of a wafer. In particular, the fabrication of the circuit and a method for detecting time dependent dielectric breakdown (TDDB) shorts and signal-margin testing for non-volatile memory array uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   a twin-cell memory which is configured to program a plurality of write operations;
   a current sense amplifier which is connected to the twin-cell memory and is configured to sense a current differential and latch a differential voltage based on the current differential;
   a plurality of current sources which are connected to the current sense amplifier and are configured to add an offset current to the current differential to create the differential voltage; and
   a margin adjustment circuit which includes a plurality of transistors and the plurality of current sources, the margin adjustment circuit is connected to the current sense amplifier through a true bitline (BLT) and a complementary bitline (BLC), and the plurality of current sources are all applied with a current mirror source voltage.

2. The structure of claim 1, wherein the twin-cell memory array comprises a first NFET device and a second NFET device.

3. The structure of claim 2, wherein the current sense amplifier is connected to the twin-cell memory array through the true bitline (BLT) and the complementary bitline (BLC).

4. The structure of claim 3, wherein the plurality of current sources are configured to add the offset current to the BLT and the BLC of the current sense amplifier to create the differential voltage.

5. The structure of claim 1, wherein the current sense amplifier comprises a latch which is configured to store the differential voltage.

6. A structure comprising:
   a twin-cell memory which is configured to program a plurality of write operations;
   a current sense amplifier which is connected to the twin-cell memory and is configured to sense a current differential and latch a differential voltage based on the current differential;
   at least one current source which is connected to the current sense amplifier and is configured to add an offset current to the current differential to create the differential voltage; and
   a margin adjustment circuit which includes a plurality of transistors and the at least one current source, and the margin adjustment circuit is connected to the current source amplifier through a true bitline (BLT) and a complementary bitline (BLC),
   wherein the plurality of transistors determine a magnitude of the offset current based on a plurality of sense amplifier input margin signals.

7. The structure of claim 6, wherein the plurality of transistors in the margin adjustment circuit are all NFET devices.

8. The structure of claim 1, wherein the twin-cell memory is connected to a wordline.

9. The structure of claim 8, wherein the twin-cell memory is connected to the wordline through a gate of a first NFET device and a gate of a second NFET device.

10. The structure of claim 1, wherein the plurality of transistors determine a magnitude of the offset current based on a plurality of sense amplifier input margin signals.

11. The structure of claim 10, wherein the plurality of transistors in the margin adjustment circuit are all NFET devices.

12. The structure of claim 11, wherein the plurality of current sources are all NFET devices.

\* \* \* \* \*